(12) United States Patent
Hoetzel et al.

(10) Patent No.: US 7,936,280 B2
(45) Date of Patent: May 3, 2011

(54) SIGNAL DISPLAY DEVICE FOR DISPLAYING THE SIGNALS ON SIGNAL PATHS

(75) Inventors: Wolfgang Hoetzel, Salzkotten (DE); Marc Nalbach, Paderborn (DE); Dirk Berneck, Weimar (DE)

(73) Assignee: dSPACE digital signal processing and control engineering GmbH, Paderborn (DE)

( * ) Notice: Subject to any disclaimer, the term of this patent is extended or adjusted under 35 U.S.C. 154(b) by 1109 days.

(21) Appl. No.: 11/676,455

(22) Filed: Feb. 19, 2007

(65) Prior Publication Data

US 2007/0211044 A1    Sep. 13, 2007

(30) Foreign Application Priority Data

Feb. 17, 2006  (DE) .......................... 10 2006 007 846
Feb. 17, 2006  (DE) .......................... 10 2006 007 847

(51) Int. Cl.
G09G 3/32 (2006.01)
(52) U.S. Cl. .................. 340/815.45; 340/513; 340/514; 340/525; 340/815.4; 340/815.43
(58) Field of Classification Search ............ 340/815.45, 340/815.4, 815.43, 500, 514, 527, 531, 539.24, 340/540, 660, 636.15, 506, 513, 525; 324/127; 700/297, 298
See application file for complete search history.

(56) References Cited

U.S. PATENT DOCUMENTS

| | | | |
|---|---|---|---|
| 4,438,396 A * | 3/1984 | Harnden et al. | 324/127 |
| 4,837,565 A | 6/1989 | White | |
| 6,150,774 A | 11/2000 | Mueller et al. | |
| 6,738,649 B2 * | 5/2004 | Suzuki | 455/574 |
| 7,103,845 B2 * | 9/2006 | Ueno et al. | 715/744 |
| 7,469,204 B2 * | 12/2008 | Brooks et al. | 703/18 |
| 2002/0047576 A1 | 4/2002 | Gurthrie et al. | |
| 2004/0070513 A1 | 4/2004 | Powell et al. | |
| 2009/0040064 A1 * | 2/2009 | Renard | 340/815.43 |

FOREIGN PATENT DOCUMENTS

| | | |
|---|---|---|
| DE | 3714072 | 11/1988 |
| DE | 9010954 | 9/1990 |
| DE | 9317946 | 2/1994 |
| DE | 9318263 | 2/1994 |
| DE | 9317097 | 3/1994 |
| DE | 4313602 | 10/1994 |
| DE | 10053377 | 5/2001 |
| EP | 0242631 | 10/1987 |

OTHER PUBLICATIONS

German International Search Report.
Agilent HLM-40xx, HLMP-08xx T-1 ¾, 2 mm×5 mm Rectangular Bicolor LED Lamps Data Sheet—Agilent Technologies—pp. 1-6.
Battery Voltage Monitor Circuit—Website: www/qsl.net/kdljv/batmon.HTM—pp. 1-2.

* cited by examiner

*Primary Examiner* — Davetta W Goins
(74) *Attorney, Agent, or Firm* — Orrick Herrington & Sutcliffe, LLP

(57) ABSTRACT

The invention relates to a signal display device for displaying signals on signal paths of a wiring harness, for example, which may be connected to the signal outputs of an electronic apparatus generating/receiving signals, or looped into the signal paths between a signal-generating electronic apparatus and a signal-receiving electronic apparatus. A signal to be displayed each time is measurable from a plurality, preferably all, of the signal paths, and each measured signal is fed to an evaluation unit that, for each measured signal, activates a multicolor display element based on a value of the signal, such that one of several colors may be displayed using the multicolor display element.

19 Claims, 7 Drawing Sheets

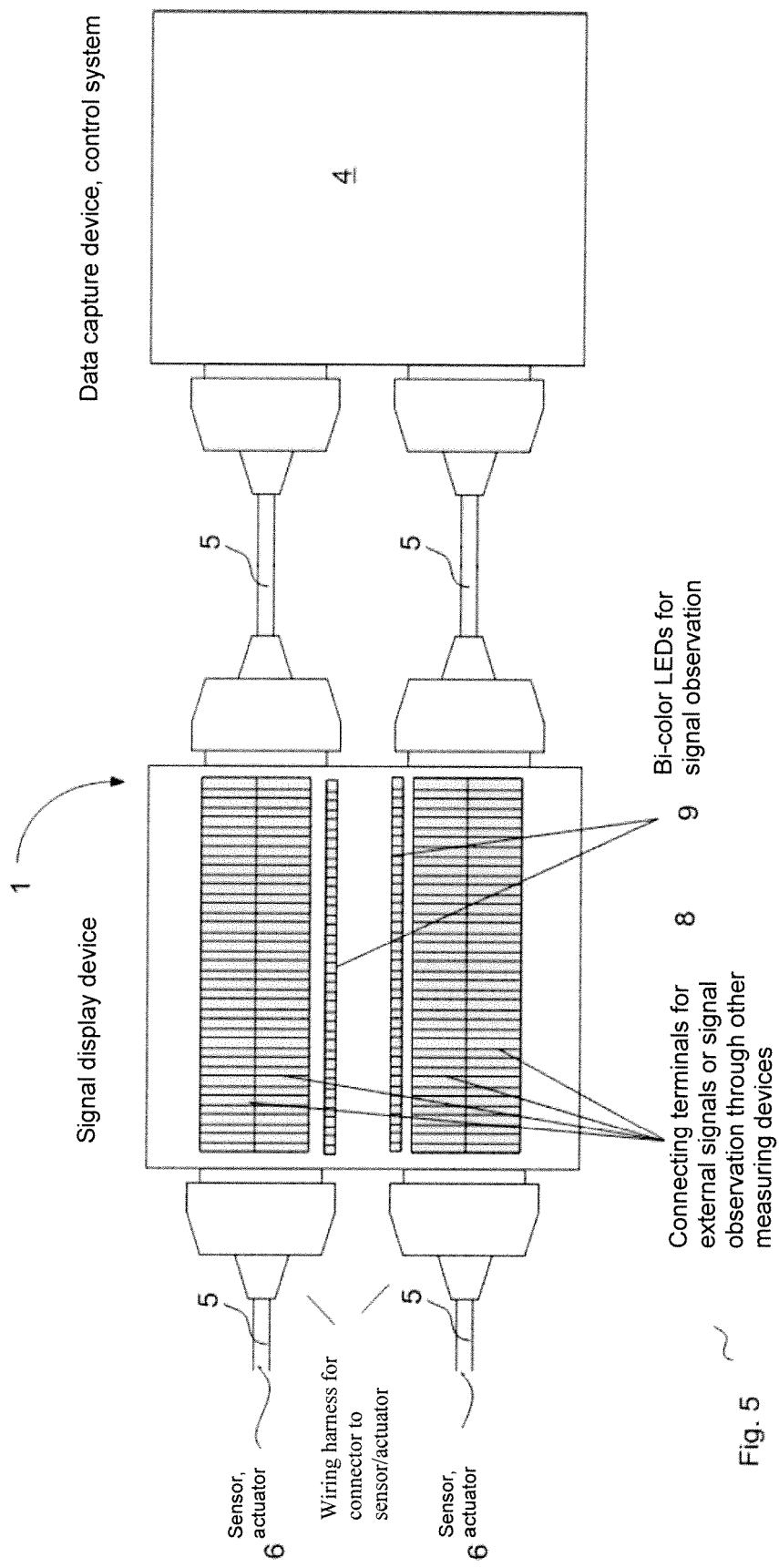

SIGNAL DISPLAY DEVICE FOR DISPLAYING THE SIGNALS ON SIGNAL PATHS

RELATED APPLICATION(S)

Applicants hereby claim priority under 35 USC §119 for German Patent Application No. 10 2006 007 846.2 filed Feb. 17, 2006, entitled "SIGNALANZEIGEVORRICHTUNG ZUR ANZEIGE DER SIGNALE AUF SIGNALWEGEN" and German Patent Application No. 10 2006 007 847.0 filed Feb. 17, 2006, entitled "VORRICHTUNG UND VERFAHREN ZUR ANZEIGE WENIGSTENS EINES ELEKTRISCHEN SIGNALS" incorporated herein by reference.

FIELD OF THE INVENTION

The invention relates to a signal display device for displaying signals, in particular on signal paths, e.g., of a wiring harness.

In developing electronic apparatuses, for example, those that communicate with one another through signals on signal paths, such as for example, wiring harnesses, it is desirable, for example, in the development phase, for the developers and service technicians to be able to control the signals.

BACKGROUND

In the area of computer peripherals, it is known, for example, for a signal path to be equipped with a simple light diode so that a developer or a service technician can determine, at least from the lit or unlit state of such an LED, whether there is a signal at all on a corresponding signal path. But it was regarded as disadvantageous, however, that when such a simple LED is used, essentially only the lit or unlit state can be evaluated as information on the existence of a signal.

Such a display does not say in which range of values a signal is found on a signal path, for example. This means that there is no information, for example, for voltages, on the amount of the voltage, or for alternating signals, on the frequency of this signal, for example.

To obtain such information, measuring devices such as multimeters or oscilloscopes are normally used, with which the signals on the signal paths to be observed are measured and displayed. However, this is very time-consuming, in particular for a plurality of signal paths, i.e., for wiring harnesses, for example, such as flat conductor cable connections between electronic apparatuses, since such signal paths must first be manually broken in order to measure the signal. Furthermore, using a multimeter or oscilloscope or a similar apparatus, each individual signal path must then be separately examined, since the mentioned display apparatuses cannot be simultaneously made available for all signal paths of such an electrical connection.

SUMMARY

In accordance with one aspect of the present invention there is provided a signal display device that, apart from rough information on whether there is a signal at all on a signal path, provides a developer or service technician with further information, for example, on a value or a signal quantity, e.g., the amount of a voltage or a frequency or amperage or the like, without having to separately examine each signal path for such desired information using special measuring instruments.

According to an embodiment of the present invention, a signal display device can be connected to the signal outputs of a signal of a generating or of a receiving electronic apparatus or can be looped into the signal paths between a signal-generating electronic apparatus and a signal-receiving apparatus, and with which a signal to be displayed each time is measurable from a plurality and, in one embodiment, all of the signal paths. Each measured signal is fed to an evaluation unit that, for each measured signal, activates a multicolor display element based on a value of the signal, such that one of several colors may be displayed using the multicolor display element.

According to one aspect of the present invention is that, when using a multicolor display y element, information is obtained not just on whether there is a signal at all on a signal path; rather, the multiple colors allow greater information content to be obtained, since each of the colors available, for example, represents different information content.

Thus, for example, for a pure voltage signal, the amount of a voltage can be contained as information in the different colors of the display. Likewise for other signals, the multiple colors may contain information on the level of a frequency, the magnitude of a flowing current, or the like. It is basically possible to evaluate each type of electronic signal and to display a desired value of this signal, such as, for instance, the aforementioned voltage level, frequency, amperage, etc., by coding using several colors.

Such an example embodiment according to the present invention of a signal display device is space-saving since, for example, only one multicolor display element must be available to display a signal on a signal path, and information content greater than that known in prior techniques can be relayed to a developer or a service technician using just this one multicolor display element.

For the normal initial service and development measures therefore, it is no longer necessary to connect complicated measuring instruments, such as multimeters or oscilloscopes, etc., in order to observe a signal on a signal path. Often, simply observing a multicolor display element suffices in order to obtain desired or necessary information about a signal on a signal path using the currently displayed color.

Here, for instance, a signal display device according to one aspect of the present invention may be made such that it may be connected as the only device, e.g., like an end device, to an electronic signal-generating apparatus. For example, such an electronic signal-generating or signal-receiving apparatus may be a vehicle control device that provides a plurality of electronic signals to control just as many possible functions in a motor vehicle. These may likewise be prototyping apparatuses.

Thus, using the connection of a signal display device according to this aspect of the present invention to connect to such an electronic apparatus, the proper functioning of this apparatus may be evaluated by examining the signals on the signal paths.

It is likewise possible, for example, when two electronic apparatuses communicate with one another via a plurality of signal paths, for example via a wiring harness, such as, for instance, a flat conductor cable connection, to place a signal display device according to one aspect of the present invention between the two apparatuses. In other words, it is possible to loop signal display devices into the signal paths of the apparatuses, so that the signals that are exchanged or communicated between the apparatuses may be displayed and observed.

Thus, provision may be made, for example, for every signal that arises or is generated via a signal path between two electronic apparatuses, or for only a desired, specific number of signals, to be displayed using the signal display device according to this aspect of the present invention. For this purpose, provision may be made for those signal paths with the signals of interest to be tapped by the signal display device according to this aspect of the present invention so that those signals are measured from the signal paths.

For this, it is advantageous in particular when a signal display device according to one aspect of the present invention exhibits such plugs and sockets that correspond with the plugs and sockets provided for in the cabling between the electronic devices. Thus, a signal display device according to this aspect of the present invention may be inserted in the signal paths between two electronic devices, without interference to the signal transmission between the electronic devices.

In another example embodiment of the invention, a multicolor display element may be designed as a multicolor LED, for example as a bi-color or tri-color LED. Such types of LEDs are advantageous in the present embodiment since they are just one very small component that, in a small design, provides the opportunity for displaying many colors.

To this end, bi-color LEDs, for example, normally exhibit a ground connection as well as two other connections, in which, after voltage is applied on one of the connections opposite the common ground connection, a bi-color LED lights up in the first of two colors, and when a voltage is applied on the second connection, lights up in a different second color.

This happens similarly with tri-color LEDs that accordingly exhibit three leads aside from a common ground connection.

Thus, using such multicolor LEDs, several kinds of information may already be shown in a simple manner since these LEDs, aside from an initial state, namely a switched-off state, which is to be understood as one color within the meaning of certain aspects of the invention, may additionally display at least two or three other basic colors so that three or four information states may be indicated in the simplest way using such multicolor LEDs.

In this case, according to the present invention, the color variety, and accordingly, the variety of information as well, may be increased, for example by making a multicolor LED activatable using an evaluation unit based on the value of the signal to be displayed, such that it is switched off or lights up in one of its basic colors or at least in one mixed color made up of at least two basic colors.

Thus, it is possible to generate mixed colors from the basic colors of a multicolor LED if the provided connections for generating the basic color are simultaneously supplied with voltage. Thus, for instance, a bi-color LED with the basic colors green and red may light up yellow when both colors are simultaneously activated.

Moreover, in a further advantageous embodiment, it is possible to activate a multicolor LED, for example, a bi-color LED, such that it can light up in at least two mixed colors. This may be achieved when a mixed color is generated by a pulse width modulated activation of the electronic portion of the multicolor LED that generates a basic color each time. Thus, through timing and through different pulse duty factors in the activation of the electronic parts of a multicolor LED generating the basic colors, a plurality of discrete mixed colors may be generated. Each such discrete mixed color may in this case represent different information, so that the information content displayed may be increased by the number of colors used.

Thus, an evaluation unit for evaluating the adjacent signals may be made suitable for activating a connected multicolor LED to each of their connections through pulse width modulated voltage, in which each pulse height, and/or pulse width, depends on the signal or its value/size.

In another execution, instead of multicolor LEDs, any other display elements or devices that are suitable for showing several discrete colors using a display may be used. The invention is not limited with respect to such display elements or devices.

In one example embodiment, it is considered advantageous when a maximum signal value range displayable with a multicolor display element, e.g., with a multicolor LED, is divided into several, equal intervals, for example, and one of the displayable colors is allocated to each interval (if necessary, including the off state of a display element) and in which the color corresponding to the interval in which the value of the signal to be displayed lies can be displayed or is displayed with a multicolor display element.

Thus, the display of a particular color using a multicolor display element may point out to a developer or service technician that there is actually a signal, e.g., in a particular voltage level, on a signal path. For example, a coding of the voltage in the colors may be made such that an idle signal path or a voltage below a minimum threshold value gives rise to a first color on the multicolor display element, which when using a multicolor LED, for example, may mean that this remains switched off.

In a maximum voltage (or a voltage above an upper threshold value), the multicolor display element may show a different color allocated to this maximum (threshold value), e.g., a multicolor LED may light up in one of its basic colors, e.g., red.

For voltage values between the idle state (or below a threshold value) and the maximum voltage (or above a threshold value), mixed colors may accordingly be generated by mixing the particular basic colors, for example of a multicolor LED, so that a developer and service technician can infer the amount of voltage by the color that shows on the display.

In one example embodiment, the application is not at all limited to the display of voltages and the magnitude of a voltage, but it may display any signal with respect to a desired value, which depends on the way that the evaluation unit in use evaluates and displays the signal fed to the evaluation unit.

Accordingly, an evaluation unit may be made programmable in a signal display device according to one aspect of the present invention in order to examine signals from signal paths for different criteria.

Instead of discrete colors, each of which is allocated to a range of values (interval), in another execution, a color of a multicolor display element may be made to change proportionally, or continuously, for example, with the size of signal value, in which the proportionality is linear, for example, or exhibits another characteristic. This allows for a multicolor LED through suitable programming and pulse width modulation, for example. Only the off state of the multicolor display element would be excluded therefrom, for example.

Such an embodiment may also be executed, for example, with a color wheel as a multicolor display element, which rotates around an axis, and for example as a result, displays to an observer a color proportional to the swing angle, and consequently, the signal value.

In another example embodiment of the signal display device according to the present invention, an allocation display may be provided on the signal display device that shows the allocation of at least some possible colors or preferably of every possible color (for discrete color stages) to at least one interval or to a single allocated signal value.

This example embodiment's advantage is that a service technician or developer, in the course of observing a multicolor display element, can immediately determine at least the current approximate value of the signal on the signal path, based on the allocation display arranged in the environment of such a display element.

Thus, using the signal display device according to this aspect of the present invention, a service technician or developer no longer needs complicated measuring devices, such as multimeters or oscilloscopes, in order to observe signals on signal paths; rather, observing the particular multicolor display element is sufficient, with the person in each case recognizing the corresponding color and being able to determine at least the current approximate value of the signal by comparing it with the color indicated on the allocation display.

In this regard, in a particular example embodiment, an allocation display may be made to display a printable report of a color that may be generated using a multicolor display element on the signal display device. Aside from such a printable report of the color, the value interval or an individual value may thereupon be specified in order to show the observing person that when this said color is displayed on the multicolor display element, the value of the signal currently lies in the specified interval or around the specified value.

It is found particularly advantageous in an example embodiment when the allocation display, in discrete colors, includes a number of multicolor display elements corresponding to the number of intervals, the number indicating a color corresponding to its interval allocation, in particular, in which, aside from a multicolor display element, an allocated interval or a value is also shown or indicated.

For this example embodiment, the same multicolor display elements used for the actual display of the current signal may also be used in the allocation display. This avoids color distortions and color differences that may arise in a printable report and, when using the signal display device according to this aspect of the present invention, a person may reliably make an allocation. This is advantageous, for example, when the aforementioned multicolor LEDs, for example bi-color or tri-color LEDs, are used as a multicolor display element.

Thus, for example, an allocation display may be designed such that a number of multicolor LEDs corresponding to the number of intervals are arranged among themselves, for example, in which each of these LEDs lights up in a particular color, e.g., one of several discrete colors. This involves a color that is subject to an allocation to a particular interval of the signal value to be observed or to a particular value as well. In this connection, an unlit multicolor LED may also be allocated to an interval/value, and such an LED may also be omitted, if necessary. In this connection, this interval or this value nevertheless remains allocated to an unlit LED.

In still another example embodiment, a maximum signal value range displayable by a multicolor display element, e.g., of a multicolor LED, may furthermore be made switchable between at least two signal value ranges. For example, a voltage range of 0-10 volts may be displayed in a first signal value range, in which this 10-volt voltage range is subdivided into six intervals, for instance. In another maximum displayable signal value range, however, it may also display a range of 0-100 volts after switching, likewise with a subdivision into six intervals, for example. Here, any number of intervals is possible.

If a service technician were to establish accordingly, for example, that a multicolor display element indicates a color that corresponds to the last interval range, i.e., corresponding to the upper signal value limit, the displayable signal value range may be switched, for example, to a greater range, as a result of which the display on the affected multicolor display element changes and a more precise allocation into the interval thereupon determined is possible.

In this connection, the switchability may be provided in that the evaluation unit receives electronic information through the switching on a switching element, for example, through a revised resistance value, when the switch is implemented through a potentiometer, for example. Likewise, a switching may automatically take place, for example, when it has been established that a signal has exceeded the range. For this purpose, an automatic range display may be provided instead of a manual switch.

Accordingly, the evaluation unit may evaluate the signals measured and supplied to the evaluation unit corresponding to the specification of an automatic or manual switch, depending on the thereupon specified maximum displayable signal value range, and display on the multicolor display element the color allocated to the corresponding interval, e.g., through a corresponding pulse width modulated activation of a multicolor LED.

In this connection, it is advantageous when each switchable, maximum displayable signal value range of a multicolor display element is subdivided into the same number of the same large intervals in each case, or, in the case of a continuous color display, a proportionality factor for allocating color to signal value changes in the evaluation unit.

The advantage is that in an allocation display of the abovementioned type, aside from the individual multicolor display elements, not just one, but if necessary, several intervals or values, each of which corresponds to a different, switchable, maximum displayable signal value/range, may be displayed or are shown. Thus there may be a type of legend in the allocation display that, in accordance with the switching range, represents the allocation of the particular colors indicated for the particular intervals/values.

In this connection, a display of the particular intervals/values and of the values given in the intervals is provided by a simple printing format. Moreover, it is also possible, aside from the multicolor display elements in the allocation display, to provide a further variable programmable display in which the display changes depending on the switching, and in each case represents the current specified interval range according to the switching. To this end, a liquid crystal display may be used, for example.

In a further embodiment of the invention, a multicolor display element may also be made activatable in a flashing manner in one allocated color, preferably in all, so that additional information content can be added through the flashing, aside from the continued lighting up in different colors. In this connection, the flashing frequency, for example, may in turn be made dependent on a status of the signal. For example, error conditions or limit errors may be indicated by the flashing and the frequency of the flashing.

Furthermore, it may also be provided that displaying a multicolor display element in a color not allocated to an interval, in particular in one of the basic colors of a multicolor LED, may also be made to indicate an exception status of the indicated signal, such as an error condition, for example.

In this example embodiment, any allocation of colors to different intervals or other information, such as errors, breakdowns, or other, are possible. For example, through the allocation display provided on the signal display device, a technician may at any time make the corresponding allocation by observing the multicolor display element and the allocation display and obtain information regarding the signal on a signal path. An allocation of color to error conditions or other conditions may likewise be available on the allocation display.

In a further example embodiment of the present invention, a signal path may be made disconnectable between the device and an apparatus, for example the apparatus receiving the signals. In this connection, when the device according to this aspect of the invention is looped into the signal path between two electronic apparatuses, the connected apparatus receiving the signal may be prevented from causing interference, for example a change in a generated signal. For example, a switch may be provided for this on the device according to this aspect of the invention, which may be disconnected manually or using a tool for disconnecting the signal path between the device and an apparatus, for example, the apparatus receiving the signals. Consequently, the signal may be evaluated and displayed, as it is provided by the apparatus generating the signal, in an unadulterated manner using the device according to this aspect of the invention.

In this connection, each signal path where a signal may be displayed on this signal path may be made to come equipped with a corresponding option for disconnection.

In a further embodiment, the device for all signal paths whose signals are supposed to be displayed, may be made to exhibit contact elements that are arranged before and/or after a signal path disconnection, for example of the aforementioned type, in which a signal may be looped externally into a signal path or be measured therefrom using such a contact element.

As a result thereof, for example, it is possible to disconnect this signal path when a defective signal on a signal path has been established and manually loop another signal into the signal path via the device according to this embodiment of the invention, so that this other signal reaches an apparatus receiving a signal, for example. For this purpose only one cable must be connected to the contact element.

In this connection, a signal path disconnection of the previously mentioned type and/or a contact element for looping in a further signal may be allocated locally to a multicolor display element so that it is quite simple for a service technician or a developer to trace the corresponding signal and loop the signal into the appropriate signal path.

Here, it is possible, as previously described, to loop in signals, but it is of course also possible to once again separately measure the signal on a contact element and feed it to another display instrument, such as, for instance, a multimeter or an oscilloscope, for example when the information obtained on the color display and the information on the interval subdivision is not sufficient for evaluating a signal.

In order to further make the work of a developer or a service technician easier with such a signal display device, the multicolor display elements, for example the multicolor LEDs, may also additionally be made to carry textual or graphic information that provides information, for example an allocation to a certain signal path. For example, the surface of an LED may be used for this. In the process, the LED may also be arranged flush with the surface of the signal display device.

The device according to an example embodiment of the invention and, here in particular, the evaluation unit in the device according to this embodiment of the present invention, may also be made to obtain its power supply through at least one of the apparatuses, for example, through the apparatus generating the signal or receiving the signal, if necessary through both, namely through the cabling between these apparatuses into which a signal display device according to one embodiment of the invention may be placed.

Particularly in the event of error, but for other maintenance work as well, it has been found particularly advantageous that with the signal display device according to one aspect of the invention, a corresponding signal path may be found in a simple manner, for example when, through corresponding programming on an apparatus generating signals, a signal path being particularly sought is set to a predetermined signal state, which is significantly recognizable on a multicolor display element. This may be done, for example, through an extraordinary color or a special flashing, or the like.

Thus, a service technician may immediately be able to identify the signal path and the allocated contact element, for example, through the accompanying display of this special color/or of the flashing on the multicolor display element in order to measure the signal on this signal path or feed another signal there. There is consequently an exceptionally easy option for carrying out in a simple manner the feeding in and feeding out of signals in a wiring harness with a plurality of individual cables and in the process each time quickly and easily identifying the cable being sought.

BRIEF DESCRIPTION OF THE DRAWINGS

An exemplary embodiment of the present invention is illustrated in the following figures.

FIG. 5: is an overview representation of the signal display device together with an apparatus generating or receiving a signal.

DETAILED DESCRIPTION

Figure 1:
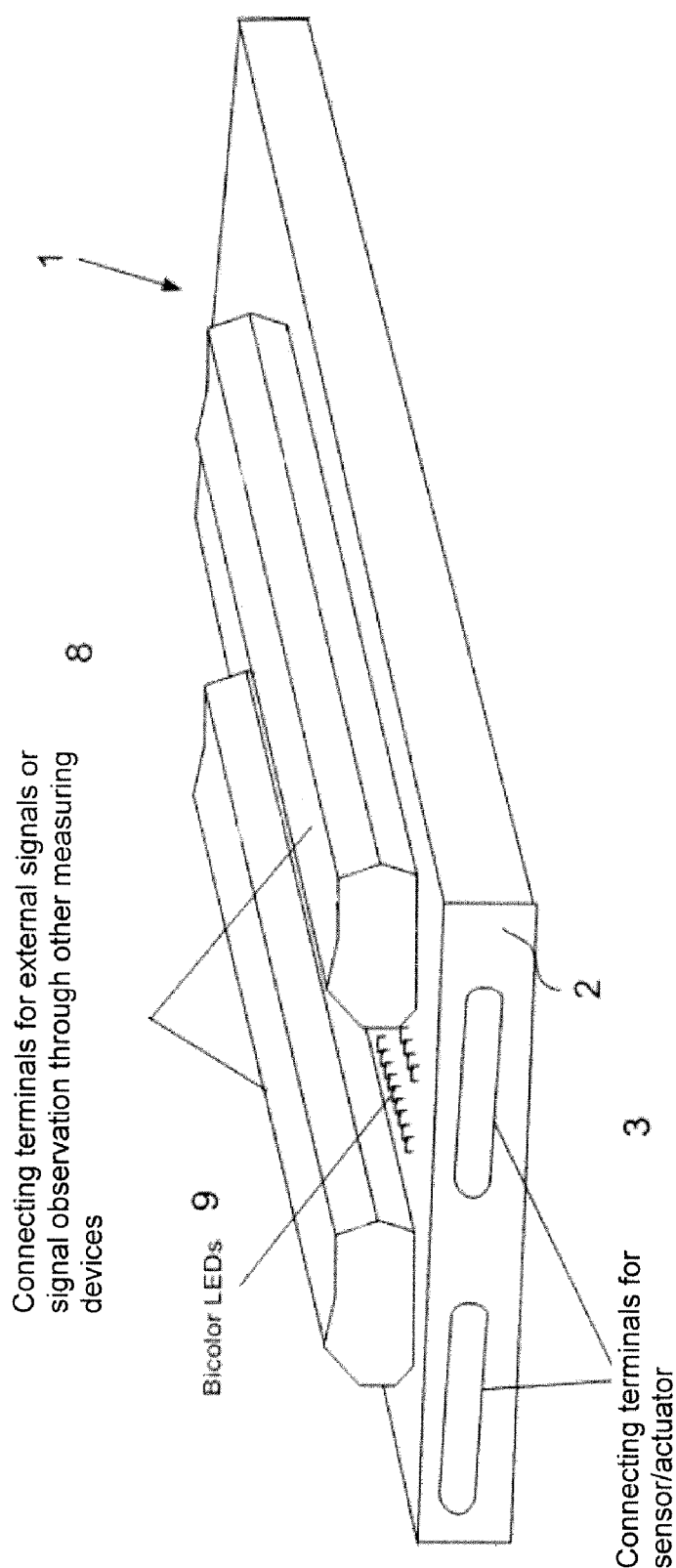
FIG. 1: is a perspective view of a signal display device according to one example embodiment of the present invention.
Figure 2:
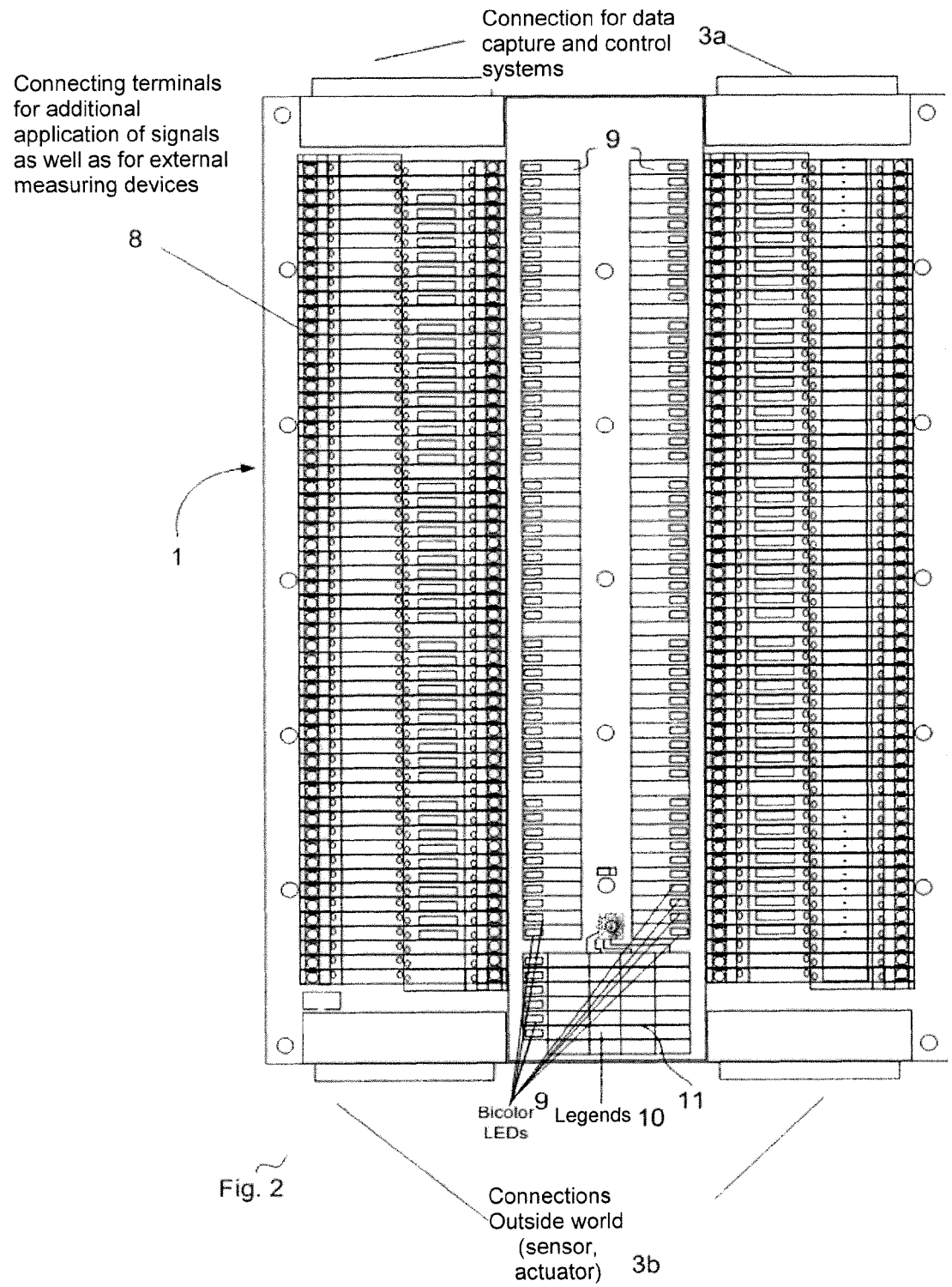
FIG. 2: is a top view of a display device according to one example embodiment of the present invention.
Figure 4A:
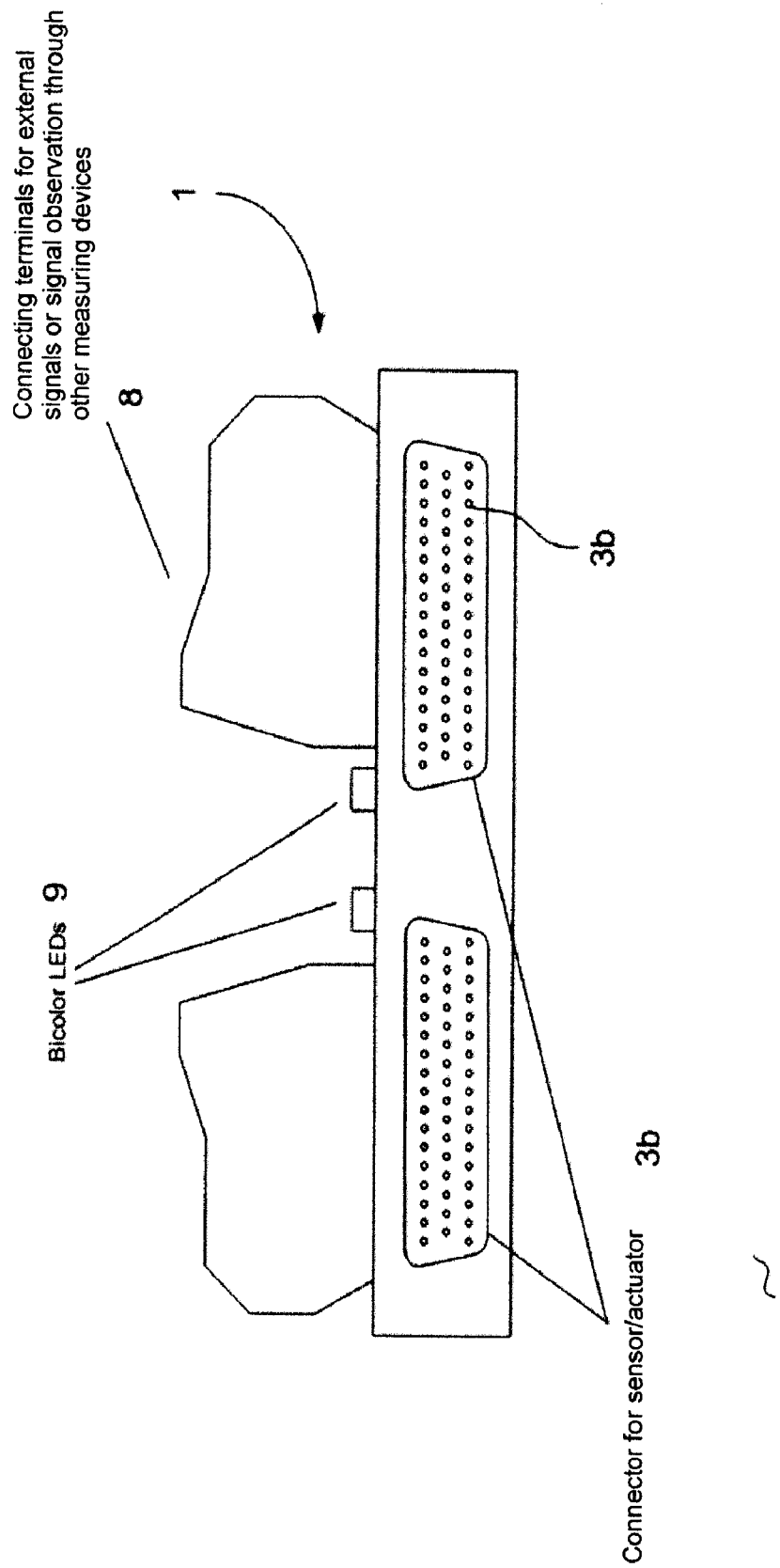
FIGS. 4a/b: are lateral views of the plug connections.
Figure 4B:
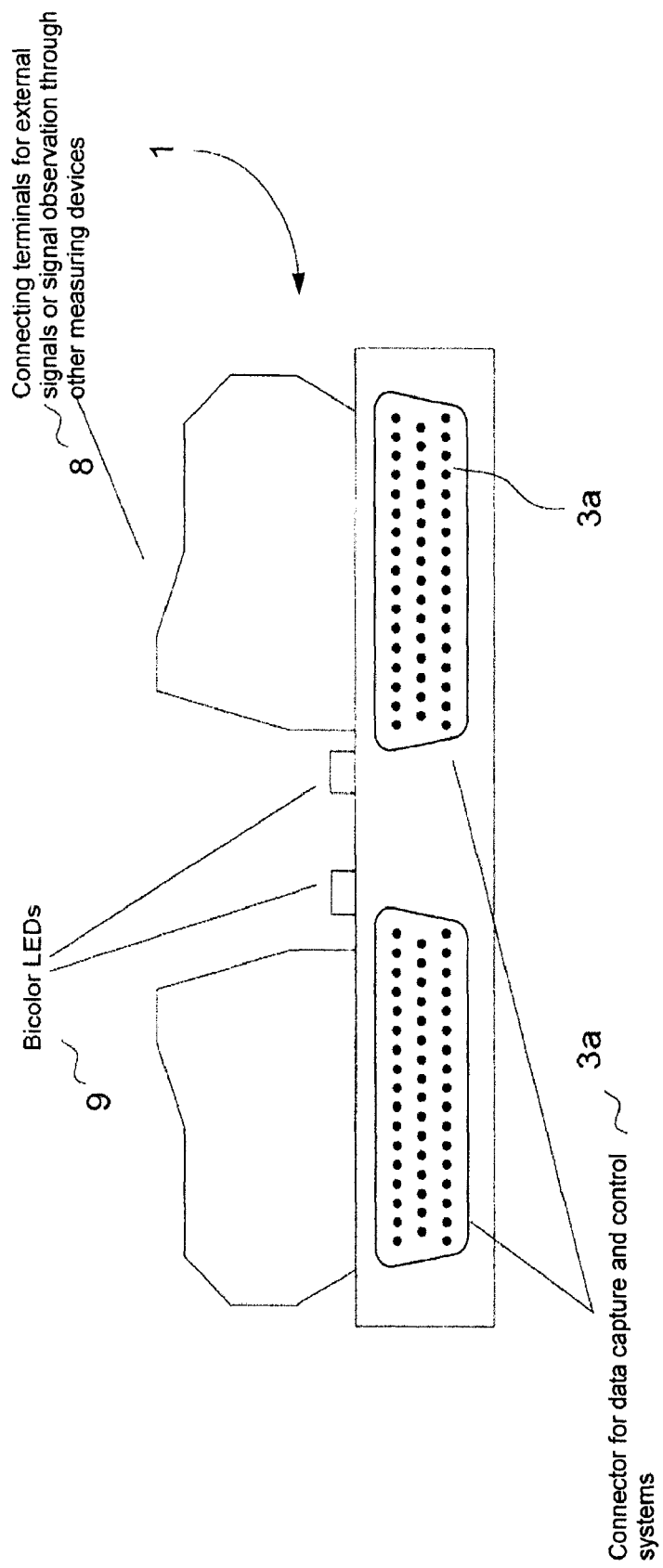
Figure 6:
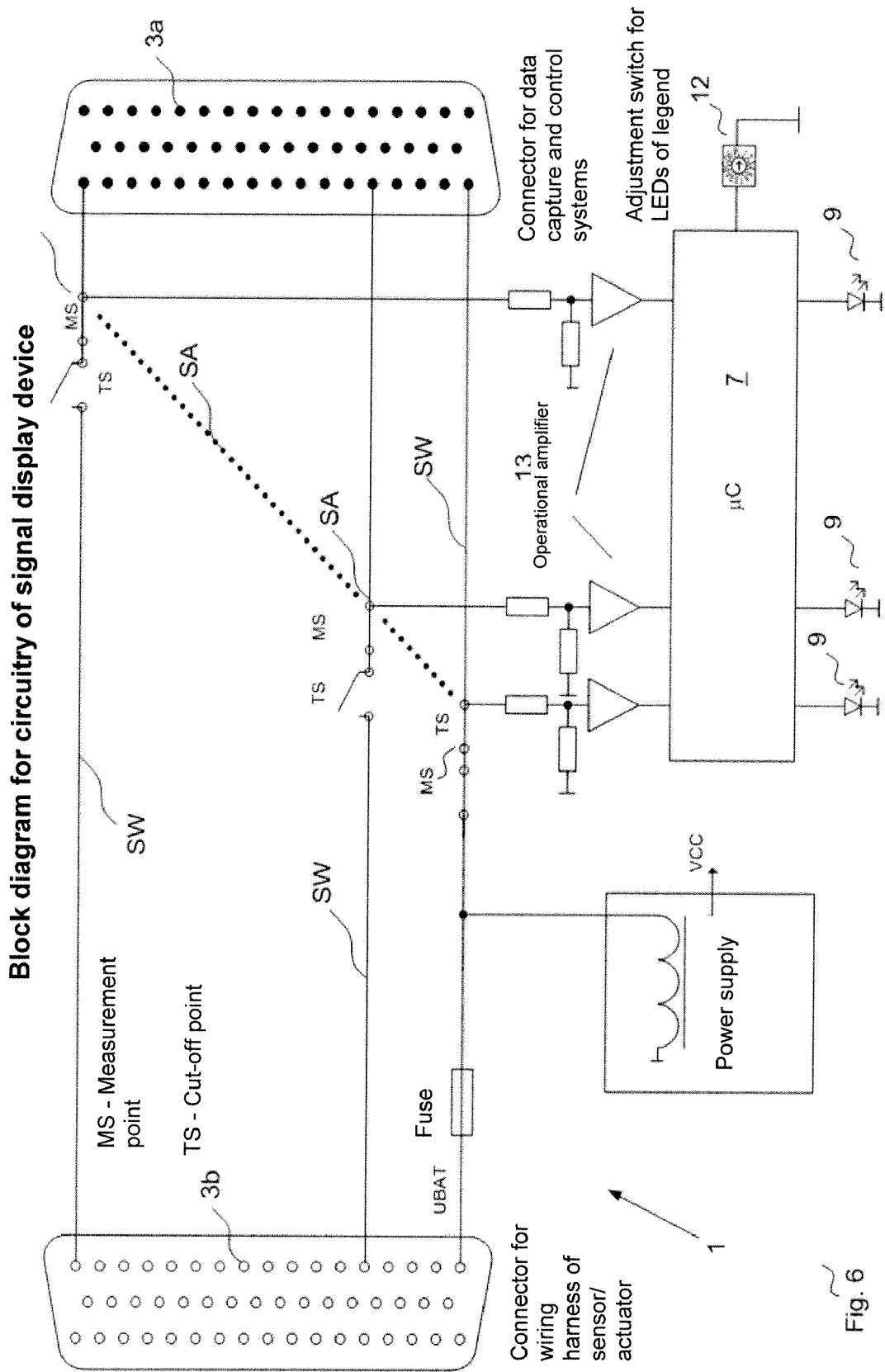
FIG. 6: is a schematic representation of the electronic circuit design of the signal display device.

FIG. 1 shows in the perspective view a signal display device 1 according to one embodiment of the present invention, which on its short sides 2 exhibits connections 3, for example plugs and/or sockets, in order to connect the signal display device 1 to an electronic apparatus 4 of FIG. 5 or to loop it into the signal path 5 of FIG. 5 between two electronic apparatuses 4, 6 of FIG. 5. For this purpose, a plug 3a as shown in FIGS. 2, 4b and 6 or socket 3b as shown in FIGS. 2, 4a and 6 are each arranged on both sides of the signal display device 1 according to this embodiment of the present invention, as FIGS. 4a and 4b show, in order to lead the lines 5, as shown in FIG. 5, which come from an apparatus 4 as shown in FIG. 5 generating a signal, straight through the signal display device 1 to an apparatus 6 receiving a signal.

This is essentially illustrated in greater detail in the schematic overview in FIG. 5, which on the right side, for example, shows a control system, e.g., a motor vehicle apparatus 4, which toward the left above the signal display device 1 according to this embodiment of the present invention is connected to a sensor or actuator 6, not shown here.

In FIG. 5, the wiring harness 5 between the signal-generating and signal-receiving apparatus is disconnected, and the signal display device 1 according to this embodiment of the present invention is used in the disconnection so that here, essentially each signal-directing signal path is electronically broken within the signal display device 1 according to this aspect of the present invention, so that the adjacent signal can be measured and evaluated and displayed using an evaluation unit in the signal display device 1.

The overview of FIG. 1 shows that connecting terminals 8 are provided on the top side of signal display device 1, on which the signals lying on the particular signal paths can be separately measured once again, or as described above, the signals on these contacts may also be fed into the signal paths and the signal paths may be disconnected on these connecting terminals as well, for which purpose switches TS (FIG. 6), for example, are provided in the connecting terminals. A bi-color LED 9 that can light up in different colors and is on the surface of the signal display device 1 according to one embodiment of the present invention are in this case allocated to each monitored signal path.

FIG. 2 shows here in greater detail, namely in a top view, the signal display device 1 according to this embodiment of the present invention with the connector plugs 3a or sockets 3b now arranged above and below in this illustration, for looping into a wiring harness 5 shown in FIG. 5. Allocated here to each signal path is a bi-color LED 9 that, when there is a signal, lights up in one of the colors it can display, thereby providing a service technician or a developer with information about the signal.

In direct proximity, here with reference to FIG. 2 on the lower end of the signal display device 1, an allocation display 10 in the form of a legend is arranged, in which six LEDs 9 are displayed on the left side of this display, the LEDs in this execution continuously lighting up each time in a different color, in which an interval 11 is imprinted to the right of each LED 9, the interval corresponding to the value range symbolizing a particular color.

Figure 3:
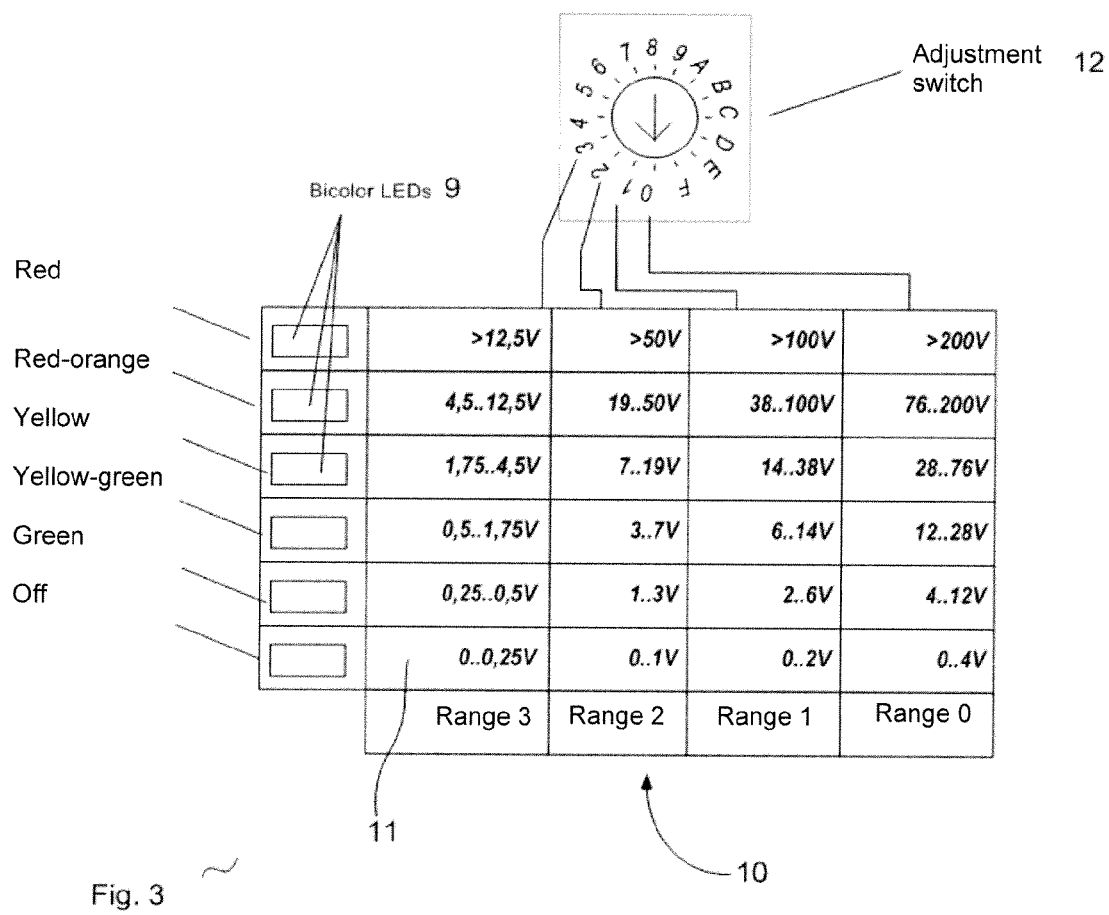
FIG. 3: is a top view of an allocation display with a switching option.

This is illustrated in greater detail in the overview of FIG. 3 of this color legend. Furthermore, signal display device 1 shown in FIG. 2 with the color legend 10 bears an adjustment switch 12, which offers the possibility of switching the maximum range of display. The ranges possible each time are likewise displayed in the color legend, so that the service personnel or a developer, upon observing this adjusted range and the particular color of an LED 9, may immediately make the allocation, in which range of values the signal is actually found on a particular signal path. Here, the color legend is designed according to FIG. 3, in such a way that it represents different voltage ranges. Other measurable electrical values, such as frequencies, currents, etc., are likewise possible here.

Through the connecting terminals 8 recognizable from the top side in FIG. 2, the previously described feeding in and feeding out of signals is possible, e.g., by connecting cables by means of banana plugs. In the example embodiment shown here, the special local side-by-side arrangement of terminals 8 and LEDs 9 are furthermore found to be particularly advantageous since the local side-by-side arrangement directly allows the optical arrangement of a terminal 8 and an LED 9 for a particular signal path, in which for instance the terminals 8 may exhibit a corresponding inscription for the signal path. The LEDs 9 or the areas beside the LEDs 9 may likewise exhibit a corresponding inscription.

By means of the signal display device 1 according to one embodiment of the present invention, the service personnel thus have a simple and economical opportunity to evaluate and assess signals on a plurality of signal paths, at least roughly in the beginning, in which, if necessary, a more detailed examination is then done through signal measurement or feeding to the terminals 8.

A technician himself will consequently no longer have to break a signal path, i.e., a cable, for example, in its insulation; rather, the signal display device according to this aspect of the present invention takes over this breaking up by providing corresponding contacts for a signal measurement and/or a signal feeding.

FIG. 6 shows by way of example the exemplary internal structure of a signal display device 1 according to this embodiment of the present invention, in which the connector plugs 3a or sockets 3b, which provide a connection to the wiring harness 5 shown in FIG. 5 and to the electronic apparatuses 4, 6, shown in FIG. 5 are illustrated to the right and left of this figure.

The signal paths running between connector plug and socket each exhibit a signal measurement SA in the signal display device according to this embodiment of the present invention, with which a signal may be measured and fed to a microcontroller 7, which forms an evaluation unit. Here, amplifying arrangements such as, for example, operational amplifier 13, may also be arranged between the measurement point SA and the microcontroller 7.

The measured signal of a signal path SW is consequently fed to the microcontroller 7, in which this, in accordance with an internal wiring, and if necessary, programming, carries out an evaluation of the signal fed, and in accordance with this evaluation, activates a multi-colored LED 9, which is allocated to each monitored signal path SW, in order to make this light up with a color from a plurality of several colors.

Here, the activation of the LEDs 9 may, for instance, be done through a pulse width modulation, which by activating different pulse duty factors of the basic colors of the multicolor LEDs may also result in a plurality of mixed colors of such an LED.

Arranged to the right of the microcontroller 7 is an adjustment switch 12, as was explained in greater detail previously in FIG. 3, and which ensures that the maximum range of display is switchable. Here, switching on the adjustment switch 12 may result in a change in the evaluation of the signal or to a resealing.

It is furthermore recognizable here that the power supply, which is likewise transmitted on a signal path SW between connector plugs 3a, 3b, may be used as well to provide the distribution voltage VCC for the microcontroller 7.

It is furthermore recognizable that each signal path SW exhibits a switch TS, by means of which the signal path SW may be opened in order to carry out an unadulterated display of the signal, which is generated, for instance, by an apparatus generating a signal to the right of this display.

The contacts MS to the right and/or the left side of each switch TS may be directed as measurement points MS to the surface of the signal display device so that in the left as well as right signal path branch on both sides of a switch TS, the adjacent signals may be measured or signals may be fed there.

The invention claimed is:

1. A signal display device for displaying signals on signal paths, comprising:
    a signal-generating/receiving apparatus having signal outputs connectable to the device and with which a signal to be displayed each time is measurable from a plurality of the signal paths;
    an evaluation unit for receiving each measured signal and which for each measured signal, the evaluation unit is operable to activate a multicolor display element based on a value of the signal; and
    a multicolor display element capable of displaying one of several colors;
    wherein the display of a multicolor display element in a color not allocated to an interval, indicates an exception status of the indicated signal.

2. A signal display device for displaying signals-on signal paths, comprising:
   a signal-generating apparatus and a signal-receiving apparatus wherein the device is looped into the signal paths between the signal-generating apparatus and the signal-receiving apparatus, and with which a signal to be displayed each time is measurable from a plurality of the signal paths;
   an evaluation unit for receiving each measured signal and which for each measured signal, the evaluation unit activates a multicolor display element based on a value of the signal; and
   a multicolor display element capable of displaying one of several colors.

3. The device according to claim 2 wherein the multicolor display element is a multicolor LED.

4. The device according to claim 3, wherein the multicolor LED is activatable using the evaluation unit based on the value of the signal to be displayed, such that it is switched off or lights up in one of its basic colors or in at least one mixed color.

5. The device according to claim 3 wherein the multicolor LED is activatable such that it can light up in at least two mixed colors, wherein one mixed color is generated by a pulse width modulated activation of the portion of the multicolor LED that generates a basic color each time.

6. The device according to claim 2 that is configured such that
   a maximum signal value range displayable with a multicolor display element is divided into several, equal intervals, wherein one of the displayable colors is allocated to each interval, and in which the color corresponding to the interval in which the value of the signal to be displayed lies can be displayed with a multicolor display element.

7. The device according to claim 2 configured such that a color indicated using a multicolor display element changes proportionally, and continuously, depending on the value of a signal.

8. The device according to claim 6 further comprising:
   an allocation display which shows the allocation of every possible color to at least one interval.

9. The device according to claim 8 wherein the allocation display includes a number of multicolor display elements corresponding to the number of intervals, with the number of multicolor display elements indicating a color corresponding to its interval allocation, wherein aside from a multicolor display element an allocated interval is indicated.

10. The device according to claim 2 as wherein a multicolor display element is activatable in a flashing manner in at least one allocated color to indicate a signal state.

11. The device according to claim 10 wherein the flashing frequency is based on a state of the signal.

12. The device according to claim 6 that is configured such that a maximum displayable signal value range of a multicolor display element is switchable between at least two signal value ranges.

13. The device according to claim 12, that is configured such that each switchable, maximum displayable signal value range of a multicolor display element is subdivided into the same number of each equal interval.

14. The device according to claim 2 that is configured such that a signal path may be disconnected between the device and the signal-receiving apparatus, using a switch in order to avoid a signal interference by the signal-receiving apparatus.

15. The device according to claim 2 wherein for all signal paths, the device exhibits contact elements in which a signal may be fed externally into a signal path using a contact element.

16. The device according to claim 14 wherein a signal path disconnection is allocated locally to a multicolor display element.

17. The device according to claim 2 wherein the evaluation unit of the device obtains its power supply through at least one of the apparatuses.

18. The device according to claim 2 wherein a contact element is allocated locally to a multicolor display element.

19. The device according to claim 14 wherein a signal path disconnection and a contact element is allocated locally to a multicolor display element.

* * * * *